United States Patent [19]

Ling et al.

[11] Patent Number: 5,977,898
[45] Date of Patent: Nov. 2, 1999

[54] DECODING SCHEME FOR A DUAL RESISTOR STRING DAC

[75] Inventors: Kuok Young Ling; Chong In Chi, both of Plano, Tex.

[73] Assignee: Texas Instruments Incorporated, Dallas, Tex.

[21] Appl. No.: 08/996,259

[22] Filed: Dec. 22, 1997

[51] Int. Cl.⁶ .............................. H03M 1/66; H03M 1/36
[52] U.S. Cl. ........................................... 341/144; 341/159
[58] Field of Search .................................. 341/144, 145, 341/133, 136, 154, 161, 159

[56] References Cited

U.S. PATENT DOCUMENTS

| | | | |
|---|---|---|---|
| 3,997,892 | 12/1976 | Susset | 341/136 |
| 4,338,591 | 7/1982 | Tuthill | 341/145 |
| 4,430,642 | 2/1984 | Weigand et al. | 341/145 X |
| 4,543,560 | 9/1985 | Holloway | 341/133 |
| 4,918,448 | 4/1990 | Hauviller et al. | 341/145 |
| 5,175,548 | 12/1992 | Kawada | 341/144 |
| 5,495,245 | 2/1996 | Ashe | 341/145 |
| 5,554,986 | 9/1996 | Neidorff | 341/145 |
| 5,568,146 | 10/1996 | Park | 341/145 |
| 5,604,501 | 2/1997 | McPartland | 341/144 |
| 5,627,537 | 5/1997 | Quinlan et al. | 341/144 |
| 5,648,780 | 7/1997 | Neidorff | 341/154 |
| 5,703,588 | 12/1997 | Rivoir et al. | 341/145 X |

*Primary Examiner*—Michael Tokar
*Assistant Examiner*—Patrick Wamsley
*Attorney, Agent, or Firm*—Bret J. Petersen; Richard L. Donaldson

[57] ABSTRACT

A decoding scheme for a dual string DAC which reduces the size of the decoding logic while also reducing the number of switches between the two strings of resistors and also eliminating the need for Op-amps between the coarse and fine resistor strings. The present invention provides a decoding circuit to select adjacent pairs of taps 24 of the coarse resistor string 12 using simple decoding blocks 36. In one embodiment of the present invention, a 14 bit decoder is constructed with a course decoding logic of four 3-bit decoders, two levels of switches, an add-one circuit, a multiplexer, and a small amount of overflow logic. An advantage of the present invention is reduced area and power needed to implement the decoding logic for a decoder having only two levels of switches between the coarse and fine resistor strings.

15 Claims, 4 Drawing Sheets

DECODING SCHEME FOR A DUAL RESISTOR STRING DAC

FIELD OF THE INVENTION

This invention generally relates to digital-to-analog converters (DAC) of the dual resistor string or two stage cascaded type formed on a single monolithic IC chip. More particularly, this invention relates to an improved decoding scheme for a dual resistor string DAC.

BACKGROUND OF THE INVENTION

A two stage cascaded converter converts a digital word into a corresponding analog voltage. The first stage includes a series string, or ladder of resistors coupled across two supply voltages for dividing the voltage into a number of incremental voltages. The first resistor string resolves higher order bits of the digital input or control word and the second resistor string resolves lower order bits. The first stage resistor string is coupled to the second stage, typically also a resistor string, by a plurality of switches and buffer amplifiers. Such arrangements are shown in U.S. Pat. Nos. 4,543,560 and 3,997,892, incorporated herein by reference. Generally, buffer amplifiers have offset voltages associated therewith and require trimming in order to obtain satisfactory conversion accuracy.

U.S. Pat. No. 3,997,892 to Susset, shows a two-stage cascaded converter wherein the first stage includes a resistor-string to produce a first voltage corresponding to a set of higher-order input bits. The second converter stage is another resistor-string arranged to produce a second voltage corresponding to a set of lower-order bits. The voltage across a selected resistor of the first stage is applied to the ends of the resistor string of the second stage, so that the latter stage produces an output effectively interpolating the selected first-stage segment voltage in accordance with the lower-order bits.

Converters such as shown by Susset have an important advantage in that they are inherently capable of monotonic performance. However, the Susset converter is practical only for use in relatively low-resolution applications. This is because the selector switch system used to make connection to the resistor string would become prohibitively large and complex for a high-resolution monolithic converter such as one capable of resolving a 14–16-bit input word. For example, the first stage of such a converter typically would have a 256-R resistor string. The complexity of the switch selector system for such a resistor string especially results from the fact that it must be able to select any pair of adjacent voltage taps of the string to produce the segment voltage for the second stage converter.

In U.S. Pat. No. 4,543,560 to Holloway, a new selector switch tree structure was provided for accessing the voltage tap points of a resistor string having 256 resistors. This tree structure made it possible to use common control lines for most of the two sets of switches on opposite sides of the resistor string, and leading respectively to alternate voltage taps of the resistor string. The selection of adjacent pairs of taps is thereby effected with a minimum of additional circuitry required to control the two sets of switches. However, this improvement to Susset requires that the voltage of every resistor tap pass through four series-connect switches. It also required the use of operational amplifiers (Op-Amps) which introduces problems with linearity. The use of op-amps is particularly troublesome when the voltage outputs of the first stage have alternating polarity that is then applied to the second resistor string.

SUMMARY OF THE INVENTION

The present invention provides a novel decoding scheme for a dual string DAC that reduces the size of the decoding logic, reduces the number of switches between the two strings of resistors, and eliminates the need for operational amplifiers. The present invention provides these and other benefits by providing a decoding scheme to select adjacent pairs of taps of the coarse resistor string using separate decoding blocks. In one embodiment of the present invention, a first string decoder is constructed with a course decoding logic of 4 3-bit decoders, two levels of switches, an add-one circuit, a multiplexer, and a small amount of overflow logic.

In an embodiment of the present invention, a two-stage cascaded (n+m) bit digital-to-analog converter includes a first n bit stage having a series-connected string of $2^n$ resistors with taps at each connection that is energized by a source of voltage so that the resistor taps present progressively differing voltage levels. The embodiment provides a tap selection scheme for selecting pairs of adjacent taps on the first stage in accordance with higher-order control bits, thereby developing segment voltages to be directed to a second m bit converter stage for interpolation in accordance with lower-order control bits. The tap selection scheme has two decoders. The first n−1 bit decoder drives one set of taps with the DAC control bits less the least significant bit, and the second decoder decodes n−1 bits to drive the switches connected to said second set of taps. Decode logic operates on the n control bits to output n−1 control bits to the second decoder. The decode logic includes an adder to add one to the n DAC control bits less the least significant bit, and a multiplexer for selecting between the output of the adder or n control bits less the least significant bit as determined by the least significant bit of n.

An advantage of the present invention is reduced area needed to implement the decoding logic for a decoder having only two levels of switches between the coarse and fine resistor strings. Reduced die area results in lower cost.

An additional advantage of the present invention is a more robust design due to the lower number of switches between resistor strings, and less clock feed through.

Another advantage of the present invention is elimination of the operational amplifiers or buffers and their attendant complexity and problems of linearity.

DETAILED DESCRIPTION OF THE PREFERRED EMBODIMENTS

The preferred embodiment of the present invention is best understood by referring to FIGS. 1–10 of the drawings, like numerals are used for like and corresponding parts of the various drawings.

Figure 1:
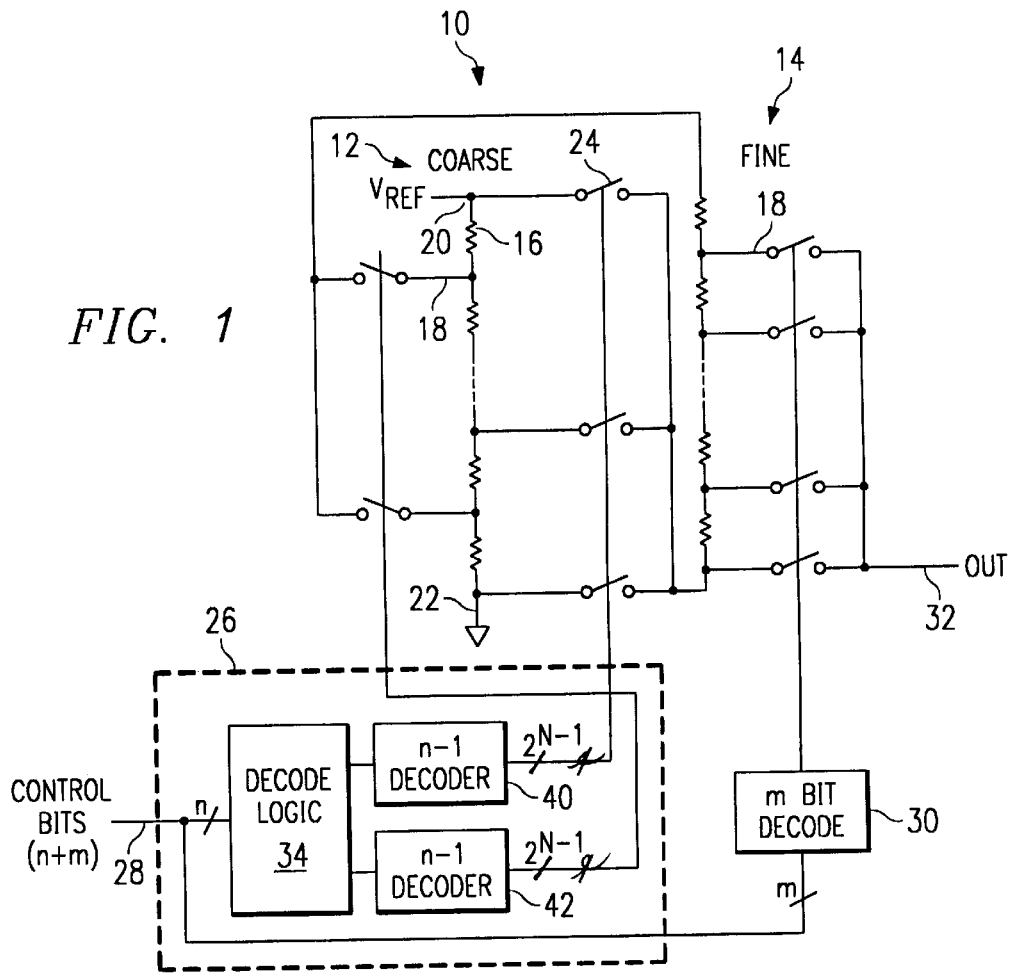
FIG. 1 is a block diagram of a dual stage cascaded DAC according to an embodiment of the present invention.

In FIG. 1, there is shown a generalized schematic of an embodiment of the present invention representing a n+m bit dual stage digital-to-analog converter 10. This DAC has two resistor strings, a coarse string 12 and a fine string 14. The resistor strings have $2^n$ resistors 16 connected serially where n is the number of data bits that can be decoded by the string. Each connection of the resistors has a connect point or tap 18 such that the resistor string has $2^n+1$ taps. The coarse string is energized by a source of voltage Vref 20 so that the resistor taps present progressively increasing voltage levels between ground or a reference 22 and Vref 20. Each of the taps is connected to a switch 24. A decode block 26 provides a tap selection circuit for selecting pairs of adjacent taps by activating the switches 24 on the coarse stage in accordance with higher-order control bits n of the input digital control word n+m 28. The selected set of taps connects the corresponding coarse string voltage to a fine m bit converter stage 14 for interpolation in accordance with lower-order control bits. The fine stage 14 is similar to the coarse stage except that the voltage presented across the resistor string is the output of the first stage rather than a reference voltage. The fine stage 14 also has taps 18 from the resistor string to switches 24 as shown. A decoder 30 with inputs of lower-order control bits m selects a single tap of the fine string as the DAC output lead 32.

The decode block 26 of the coarse string includes decode logic 34 which operates on higher order bits n to output to two or more decoders 36. In the illustrated embodiment, decoders 36 are n–1 bit decoders with $2^{n-1}$ output lines for activating the coarse string switches 24. This novel decoding scheme for a dual string DAC reduces the size of the decoding logic while also reducing the number of switches between the two strings of resistors. In the illustrated embodiment, two n–1 decoders have replaced a single n bit decoder with only a small amount of additional decode logic 34 as discussed below. The present embodiment also eliminates the need for buffers or Op-amps with only a single level of switches compared to prior art designs. While it will be apparent to one skilled in this art, additional levels of switches can be added to further reduce the size of decoders 36. For example, the two n–1 bit decoders could be replaced with 4 decoders, with a combined size of n–1 bits, by adding an additional level of switches on either side of the coarse decoder as described below. Apparently this is the first decoder to efficiently reduced the size of the decoder before adding additional levels of switches.

Figure 2:
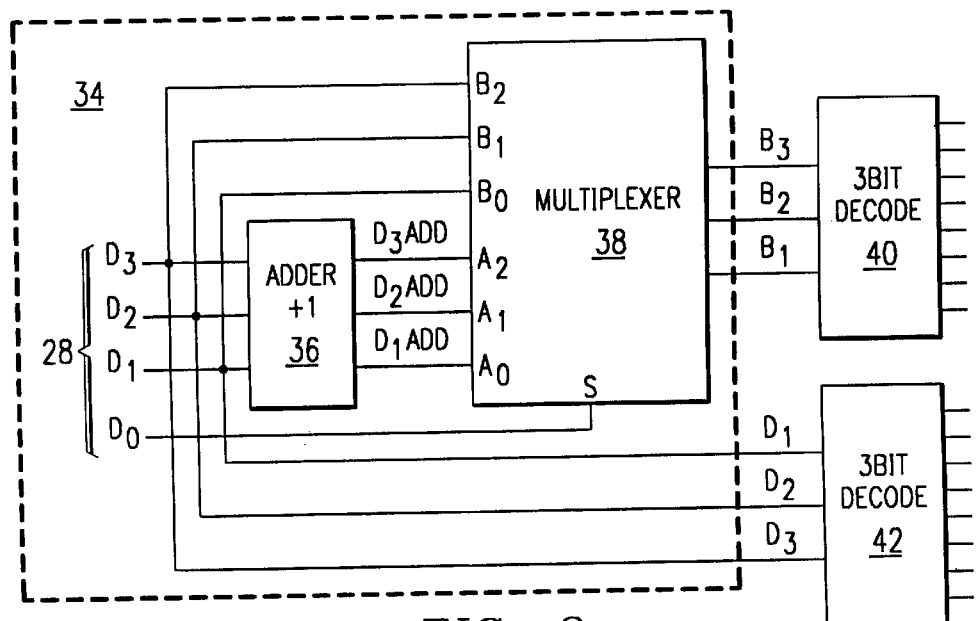
FIG. 2 is a block diagram of Decoding logic for an embodiment of the present invention.

FIG. 2 shows a schematic of decode block 26 according to an embodiment of the present invention. In the illustrated embodiment of FIG. 2, n is assumed to be 4 bits. Accordingly, the DAC control input 28 is 4 bits, namely, D3, D2, D1, and D0. The decode logic 34 includes an add-by-one adder 36, a 2-to-1 multiplexer 38. The decode block 26 includes the decode logic 34 and two 3 bit (n–1) decoders 40,42. Adder 36 adds a logical one to the binary code represented on DAC control bits D3, D2, D1 and outputs the result on D3add, D2add, and D1add. D3add, D2add, and D1add from the adder are connected to multiplexer 38 at one set of the multiplexer inputs. Connected to the second set of multiplexer inputs is the DAC control bits D3, D2, D1. The least significant bit of the n control bits, or D0, is applied to the multiplexer 38 select input to select between the DAC control bits D3, D2, D1; or DAC control bits plus one, D3add, D2add, and D1add. The output of the multiplexer 38 on lines B3, B2, B1 is then connected to a 3 bit decoder 40. The output of this decoder is connected to the first set of tap switches on the coarse decoder on the side with the bottom-most tap as described above and shown in FIG. 1. For example, the decoder output corresponding to 000 is connected to the bottom tap, the decode output corresponding to 001 is connected to the second tap of the same set and so forth. The second decoder 42 is also a 3 bit decoder with inputs of DAC control bits less the least significant bit of n bits, namely D3, D2, and D1. The second decoder output drives the second set of switches connected to taps of the coarse string, in the same manner as for the first set of taps.

Figure 3:
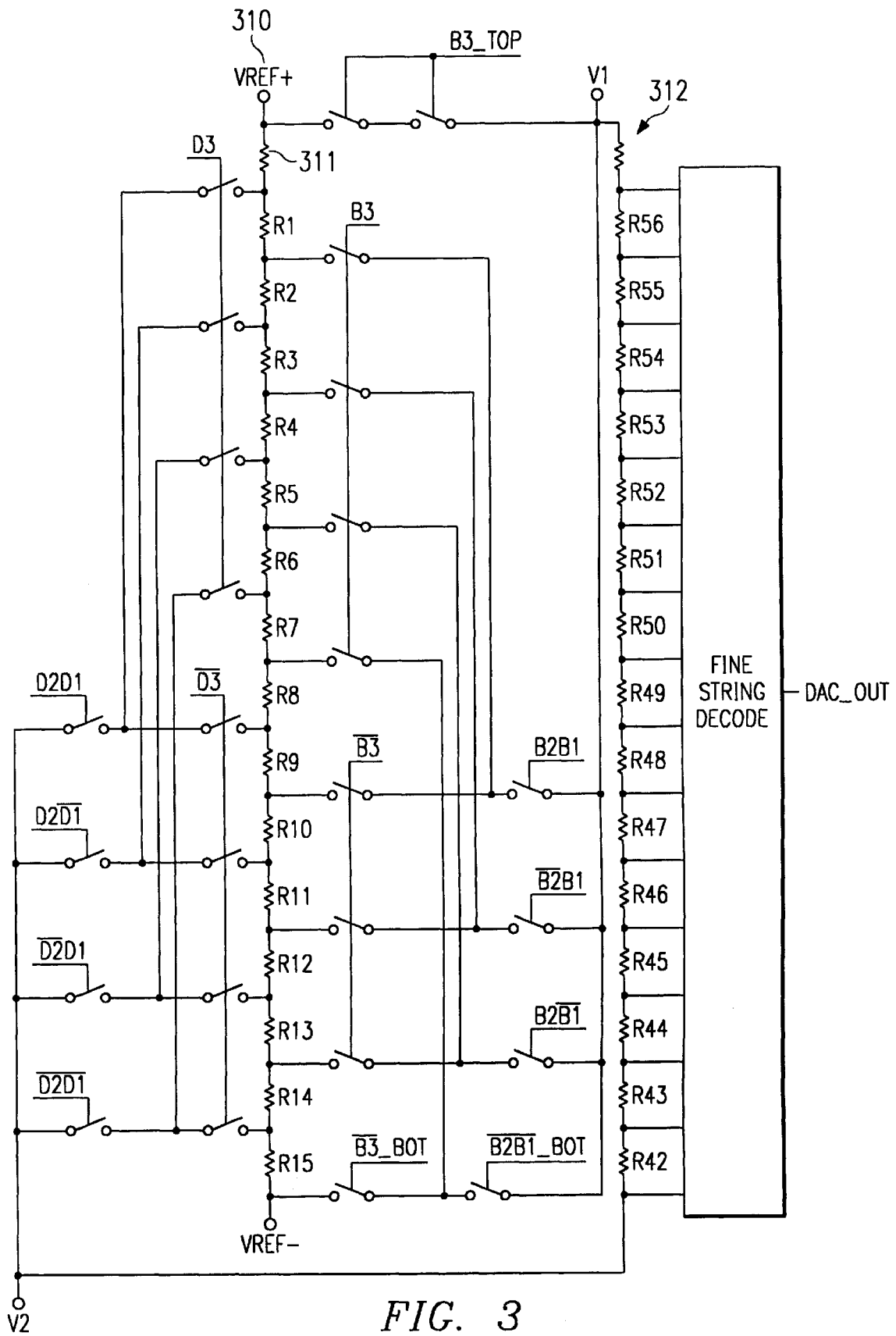
FIG. 3 is a schematic of another embodiment illustrating an eight bit DAC using two 4 bit resistor strings.

FIG. 3 illustrates a schematic diagram of another embodiment of the present invention. In this illustration, an eight bit (n+m=4+4) DAC is shown with a coarse string 310 accordingly having 16 resistors 311. In this embodiment, two levels of switches are used on each side of the coarse resistor string. Each side of the coarse resistor string will require two decoders, with a combined size of 3 bits (n–1). As shown, the right side of the coarse string is first divided by a one bit decode using DAC control word bit B3, followed by a two bit decode using DAC control word bits B2 and B1. The left side of the coarse string operates in a similar manner. The top and bottom switches of the right side are driven with additional logic to compensate for overflow and underflow and are described below in reference to FIG. 7.

Figure 4:
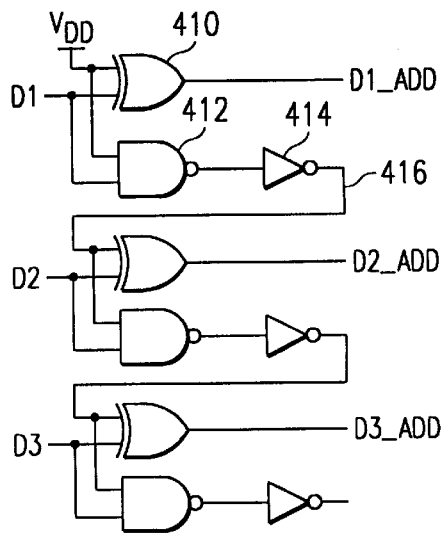
FIG. 4 is a three bit adder circuit for the first 4 bit string decoder of the eight bit DAC of FIG. 3.

FIGS. 4, 5, 6 and 7 illustrate schematic diagrams to implement the functionality of the decoder block 16 (FIGS. 1,2) for the DAC of the embodiment shown in FIG. 3. FIG. 4 is a simple adder. The LSB, D1, along with a logic level one provided by Vdd is connected to a first "exclusive or" gate 410. The output of the exclusive or is D1 plus one, namely D1_add. The and function shown as a Nand gate 412 followed by an inverter 414 perform a logic And of D1 and logic one input by Vdd to determine the carry to the next bit. The carry bit 416 takes the place of the logic level one in the previous bit to continue the cycle to perform an add-by-one function to the DAC control bits.

Figure 5:
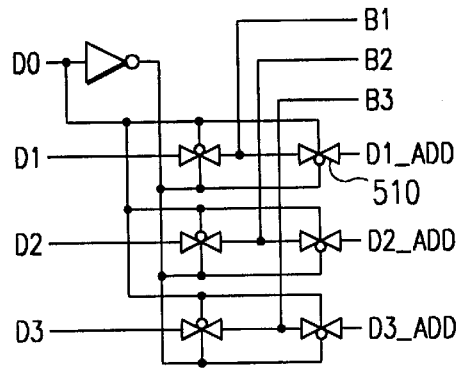
FIG. 5 is a three bit multiplexer circuit for the first 4 bit string decoder of the eight bit DAC of FIG. 3.

FIG. 5 is a typical 3 input by 1 bit multiplexer operating on the DAC control bits and the output of the add by one adder. The multiplexer consists of opposing sets of transmission gates 510 with DAC control bits and add-by-one bits applied to the opposing inputs of the transceivers. The DAC control bit D0 will enable DAC control bits D1 through D3 onto the B1 to B3 outputs when D0 is a logic 0, and will enable the add by one inputs D1_add through D3_add onto the B outputs when D0 is a logic 1.

Figure 6:
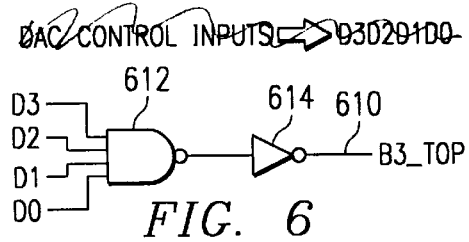
FIG. 6 is a top switch decode circuit for the first 4 bit string decoder of the eight bit DAC of FIG. 3.
Figure 7:
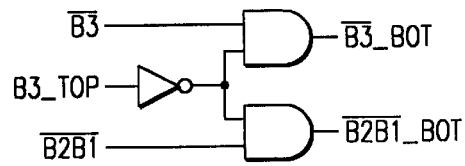
FIG. 7 is a bottom switch decode circuit for the first 4 bit string decoder of the eight bit DAC of FIG. 3.

FIGS. 6 and 7 illustrate schematic diagrams for logic to control the top and bottom switches of the right side of the coarse resistor string. There is an inherent anomaly in the add by one and multiplexer combination described above for controlling the coarse resistor switches. When the DAC control input is all ones, the output of the above decode logic will choose the bottom switches rather than the top switch due to the add by one now zero and the DAC control input D0 is also a one to choose the add by one input to the multiplexer. This situation will be referred to as a carry error. The circuit of FIG. 6 provides an output $B3_{13}$top 610 which indicates when the top switch should correctly be turned on. This circuit is simply an AND function of each of the DAC control inputs D0 through D3 (shown here as an NAND gate 612 followed by an inverter 614).

FIG. 7 is the control logic for the bottom decode switches. It functions to turn off the normal decode logic control of the switches when $B3_{13}$top signal is asserted. This prevents the carry error, discussed above, by preventing the assertion of these control signals to the two bottom switches (S16 and S20) when the $B_{13}$top signal indicates the top switches (S0 and S58) are being activated.

The operation of the decode block described above is quite straightforward but with powerful results. Starting at DAC control inputs of 0000, the decode logic (in combination with the decoders) simply chooses the taps associated with the bottom coarse string resistor to apply to the fine string resistor. When DAC control inputs of 0001, the decode logic chooses the second tap on the right side of the coarse string by selecting the add one through the multiplexer, and it again chooses the bottom tap for the left side. Further, for a DAC control input of 0010, the left tap increments and the right side tap remains the same as for 0001. This process continues as the DAC control input is incremented in binary value. When the all ones condition is reached, the overflow condition occurs and it is necessary for additional logic to correctly assert the top switches rather than the bottom switches.

Figure 8:
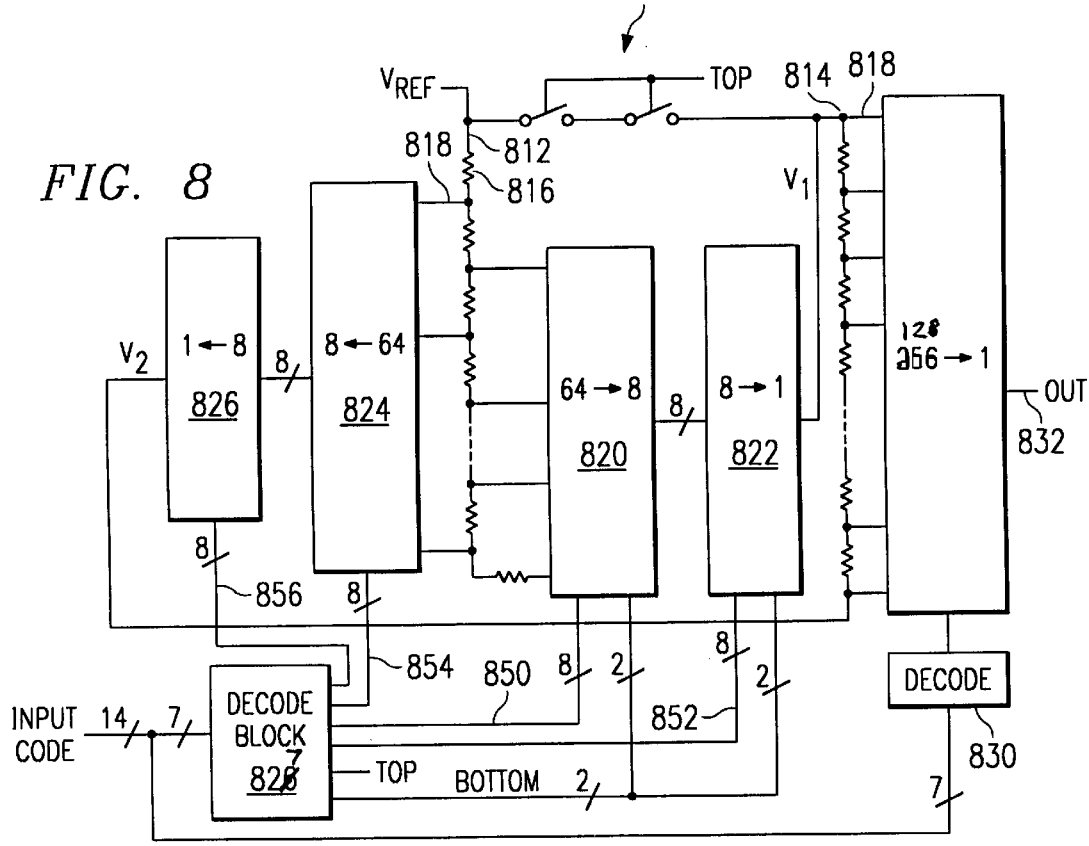
FIG. 8 is a block diagram of a dual stage cascaded DAC according to another embodiment of the present invention

FIG. 8 illustrates a generalized schematic of a preferred embodiment of the present invention, a 14 bit decoder 810 with a course decoding logic of 4 3-bit decoders and two levels of switches. This DAC has two resistor strings, a coarse string 812 and a fine string 814 with a general structure as discussed above with reference to the previous figures. In FIG. 8 the coarse string is abbreviated and the switches are shown as blocks for illustration purposes. The fine string 814 has taps 818 to connect to a switch block 827. A decoder 830 with inputs of 7 lower-order control bits selects a single tap of the fine string as the DAC output lead 832. The fine string 814, illustrated combined with the fine string decode, can be made in any manner as known in the prior art.

The coarse resistor string 812 and fine resistor string 814 in this embodiment each have 128 resistors 816 connected serially. Taps 818 connect the resistor terminations to switch blocks 820, and 824. Switch blocks 820 and 824 are connected to switch blocks 822 and 826 respectively. In this embodiment, switch blocks 820 and 824 contain 64 switches connected in 8 groups such that a single input can activate 8 switches to connect 8 taps to the 8 outputs of the switch blocks 822 and 826. This is the same functionality as shown in FIG. 3 and described above. Similarly, switch blocks 822 and 826 contain 8 switches connected such that a single input can activate 1 switch to connect 1 output of the previous switch blocks 820 and 824 to outputs of switch blocks 822 and 826 on lines V1 and V2. The outputs of the switch blocks 822 and 826, V1 and V2, are then connected to the fine string 814.

A decode block 827 provides a tap selection circuit for selecting pairs of adjacent taps of the coarse resistor string 812 by activating the switches of switch blocks 820, 822, 824 and 826 using higher-order control bits of the input digital control word 828. The decode block operation and function is analogous to the decode block discussed with reference to FIGS. 4–7, with the block appropriately modified to add and multiplex 8 bits.

Figure 9:
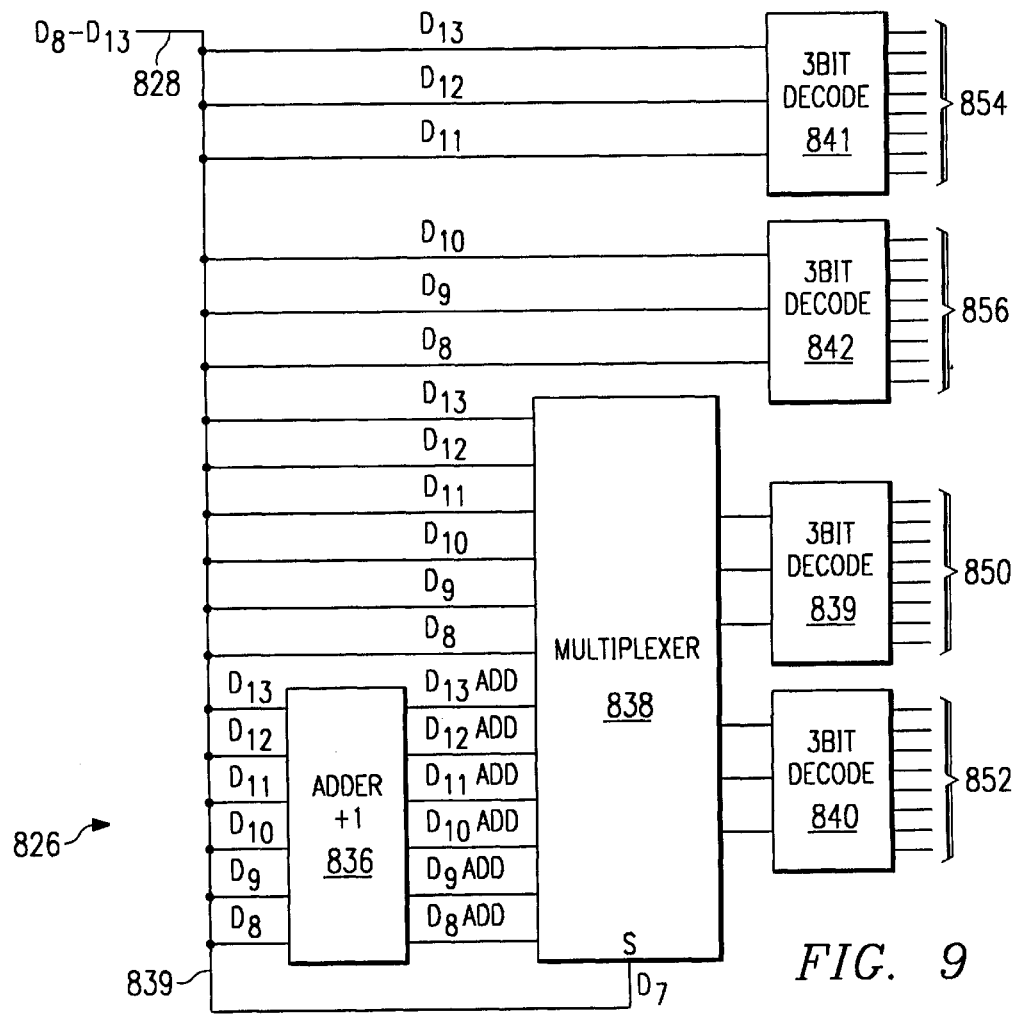
FIG. 9 is a block diagram of Decoding logic for an embodiment of the present invention.

The decode block for the embodiment of FIG. 8 is illustrated in FIG. 9. The decode block 826 includes an input control code of the higher-order control bits $D_8$ through $D_{13}$ 828. These control bits are input to an adder 836, the multiplexer 838 and to two 3-bit decoders 841, 842. The adder 836 adds a logic one to the control bits as discussed for the previous embodiment. The multiplexer 838 has a select input 839 which selects either input from the control bits 828 or from the adder 836 to output to the decoders 839, 840. Decoder 839 has output 850 that is connected to and drives switch block 820, and decoder 840 has output 852 that is connected to and drives switch block 822. Decoders 841 and 842 have outputs 854 and 856 that are connected to and drives switch blocks 824 and 826 respectively.

Figure 10:
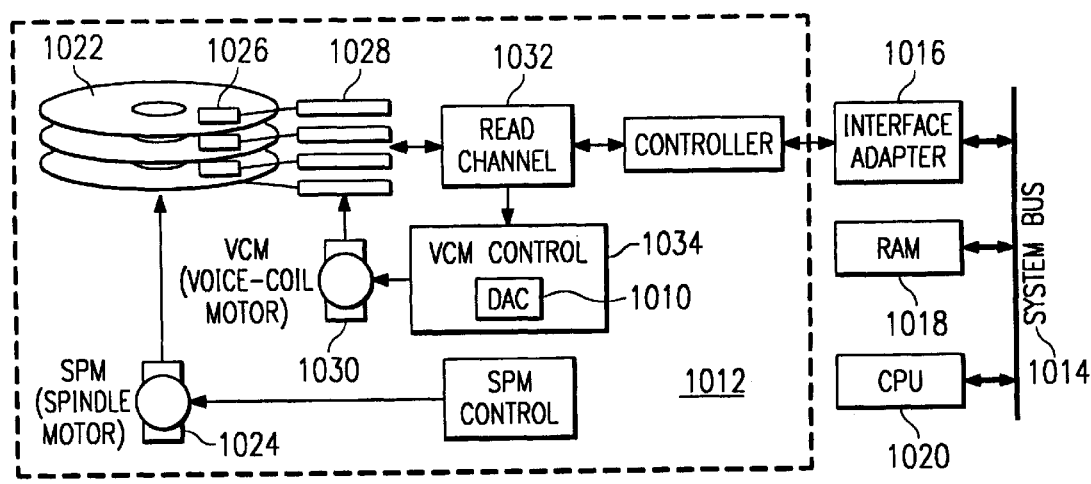
FIG. 10 is a block diagram of a computer disk drive with DAC for controlling the voice coil motor illustrating another embodiment of the present invention.

FIG. 10 illustrates an embodiment of the present invention, a computer disk drive system 1000 utilizing a DAC 1010. The disk drive 1012 connects to a computer system bus 1014 through an interface adapter 1016. The computer system bus typically includes ram 1018 and a central processing unit (CPU) 1020. The disk drive 1012 has one or more platters 1022 which rotate with spindle motor 1024. Disk heads 1028 read information stored on the platters as magnetized regions of the platter. The heads 1026 ride on actuators 1028 and are moved across the surface of the platters 1022 by a voice-coil motor 1030. The heads convert changes in magnetic fields from the regions on the platters to electrical pulses. The electrical pulses are fed from the heads to a read channel circuit 1032 which interprets the electrical pulses into data. The read channel 1032 also sends head location information to the voice coil motor control circuit 1034. The voice coil motor control circuit 1034 includes a DAC 1010. DAC 1010 is used to accurately control the drive current to the voice coil motor 1030.

An advantage of the present invention is reduced area needed to implement the decoding logic for a decoder having only two levels of switches between the coarse and fine resistor strings. Reduced die area results in lower cost. Also, since the buffers or op-amps are not necessary because of the reduced number of switch levels, the problems associated with flipping the polarity on the fine string, such as linearity, are not an issue in this design. Flipping polarity was compensated for in some prior art designs by having two sets of switches for each tap, but this is also a very costly alternative in terms of die size.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments. For example, the decoding scheme of the present invention could be applied to a resistor string type DAC having more than two stages, where the examples illustrated herein have been limited to a dual stage DAC.

What is claimed is:

1. A two-stage cascaded digital-to-analog converter comprising:
   a. inputs for n high order control bits and m low order control bits;
   b. a first n bit stage comprising a series-connected string of $2^n$ resistors having taps at each connection and energized by a source of voltage so that the resistor taps present progressively differing voltage levels;
   c. a second m bit converter stage;
   d. a first and second set of taps wherein each set includes alternating taps of said first stage;
   e. switches connected to said first and second set of taps; and f. a tap selection circuit for selecting pairs of adjacent taps on said first stage in accordance with high-order control bits, thereby to develop segment voltages to be directed to said second stage for interpolation in accordance with low-order control bits, said tap selection circuit including:

(1) a first decoder which decodes a first n−1 bits to drive said switches connected to said first set of taps, where said first n−1 bits are the n control bits less the least significant bit;

(2) a second decoder which decodes a second n−1 bits to drive said switches connected to said second set of taps; and (3) decode logic which operates on said n control bits to output said second n−1 control bits to said second decoder.

2. A converter according to claim 1, wherein said decode logic further comprises;

i. an adder having an output including an add-by-one of the digital code represented on the n control bits less the least significant bit; and ii. a multiplexer for selecting between the add-by-one output of said adder or said n control bits less the least significant bit, where the selection is determined by the least significant bit of n, and wherein the output of the multiplexer is the second n−1 bits coupled to said second decoder.

3. A converter according to claim 2, further comprising logic to drive the switch connected to the top and bottom tap of said first stage which corrects for the decode input of all logical ones.

4. A converter according to claim 3, wherein said logic to drive said top switch comprises an And function of each of the DAC control bits to close at least one top switch of said first n-bit stage when said DAC control bits are all ones.

5. A converter according to claim 3, wherein said logic to drive said bottom switch comprises an And function of each of the DAC control bits to disable closing at least one bottom switch of said first n-bit stage when said DAC control bits are all ones.

6. A two-stage cascaded 14-bit digital-to-analog converter comprising:

a. a first 7-bit stage comprising a series-connected string of 128 resistors having taps at each connection and energized by a source of voltage so that the resistor taps present progressively differing voltage levels;

b. a first and second set of taps wherein each set comprises alternating taps of said first stage;

c. a tap selection circuit for selecting pairs of adjacent taps on said first stage in accordance with high-order control bits, thereby to develop segment voltages to be directed to a second m bit converter stage for interpolation in accordance with low-order control bits, said tap selection circuit includes:

(1). two levels of switches connected to said first and second set of taps where said first level of switches connects 64 taps in sets of 8 to a second level of switches, where each switch of the second level has inputs connected to one of each set of 8 of the first level of switches and an output connected in common, such that a three bit decode input selects the first level of switches and a three bit decode of lower order bits selects the switch of the second switch level;

(2). a first set of two 3-bit decoders with inputs of the control words 6 most significant bits and outputs to drive two levels of switches of the first set of taps;

(3). a second set of two 3-bit decoders that drive said switches connected to said second set of taps;

(4). decode logic which operates on said control words 6 most significant bits control bits to output 3 bits to each of said second set of 3-bit decoders.

7. The digital to analog converter of claim 6, wherein said decode logic comprises;

i. an adder to add one to said control words 6 most significant bits;

ii. a multiplexer for selecting between the output of said adder or said control words 6 most significant bits where the selection is determined by the least significant bit of the control word.

8. A converter according to claim 7, further comprising logic to drive the switch connected to the top and bottom tap of said first stage which corrects for the decode input of all logical ones.

9. A converter according to claim 8, wherein said logic to drive said top switch comprises an And function of each of the DAC control bits to close at least one top switch of said first n-bit stage when said DAC control bits are all ones.

10. A converter according to claim 8, wherein said logic to drive said bottom switch comprises an And function of each of the DAC control bits to disable closing at least one bottom switch of said first n-bit stage when said DAC control bits are all ones.

11. A computer disk drive system comprising:

a. a voice coil motor for driving an actuator in said disk drive;

b. a voice coil motor control circuit having a digital to analog converter comprising:

(1) inputs for n high order control bits and m low order control bits, where n and m are whole numbers;

(2) a first n bit stage comprising a series-connected string of $2^n$ resistors having taps at each connection and energized by a source of voltage so that the resistor taps present progressively differing voltage levels;

(3) a second m bit converter stage;

(4) a first and second set of taps wherein each set includes alternating taps of said first stage;

(5) switches connected to said first and second set of taps; and (6) a tap selection circuit for selecting pairs of adjacent taps on said first stage in accordance with said high-order control bits, thereby to develop segment voltages to be directed to said second stage for interpolation in accordance with lower-order control bits, said tap selection circuit including:

(a) a first decoder which decodes n−1 bits to drive said switches connected to said first set of taps, where said n−1 bits are the n control bits less the least significant bit;

(b) a second decoder which decodes n−1 bits to drive said switches connected to said second set of taps; and (c) decode logic which operates on said n control bits to output n−1 control bits to said second decoder.

12. A disk drive according to claim 11, wherein said decode logic further comprises;

i. an adder to add one to the n bits less the least significant bit;

ii. a multiplexer for selecting between the output of said adder or said n bits less the least significant bit where the selection is determined by the least significant bit of n.

13. A disk drive according to claim 12, further comprising logic to drive the switch connected to the top and bottom tap of said first stage which corrects for the decode input of all logical ones.

14. A disk drive according to claim 13, wherein said logic to drive said top switch comprises an And function of each of the DAC control bits to close at least one top switch of said first n-bit stage when said DAC control bits are all ones.

15. A disk drive according to claim 13, wherein said logic to drive said bottom switch comprises an And function of each of the DAC control bits to disable closing at least one bottom switch of said first n-bit stage when said DAC control bits are all ones.

* * * * *